United States Patent
Xu et al.

(10) Patent No.: US 11,398,832 B2
(45) Date of Patent: Jul. 26, 2022

(54) DATA COMPRESSION METHOD AND APPARATUS, AND COMPUTER READABLE STORAGE MEDIUM

(71) Applicant: CANAAN BRIGHT SIGHT CO., LTD., Beijing (CN)

(72) Inventors: Bing Xu, Beijing (CN); Nangeng Zhang, Beijing (CN)

(73) Assignee: CANAAN BRIGHT SIGHT CO., LTD.

( * ) Notice: Subject to any disclaimer, the term of this patent is extended or adjusted under 35 U.S.C. 154(b) by 0 days.

(21) Appl. No.: 17/042,603

(22) PCT Filed: Jun. 27, 2019

(86) PCT No.: PCT/CN2019/091011
§ 371 (c)(1),
(2) Date: Sep. 28, 2020

(87) PCT Pub. No.: WO2020/015481
PCT Pub. Date: Jan. 23, 2020

(65) Prior Publication Data
US 2021/0099187 A1 Apr. 1, 2021

(30) Foreign Application Priority Data
Jul. 19, 2018 (CN) .......................... 201810794662.9

(51) Int. Cl.
*H03M 7/40* (2006.01)
*H03M 7/30* (2006.01)

(52) U.S. Cl.
CPC .............. *H03M 7/40* (2013.01); *H03M 7/30* (2013.01); *H03M 7/4006* (2013.01)

(58) Field of Classification Search
CPC ........ H03M 7/40; H03M 7/30; H03M 7/4006; H03M 7/4031; H03M 13/39;
(Continued)

(56) References Cited

U.S. PATENT DOCUMENTS 5,574,449 A * 11/1996 Golin ...................... H03M 7/40
341/67
5,836,003 A * 11/1998 Sadeh ................. H03M 7/3084
341/51
(Continued)

FOREIGN PATENT DOCUMENTS

CN  101501999   8/2009
CN  102164019   8/2011
(Continued)

OTHER PUBLICATIONS

English Translation of the International Search Report (ISR) for PCT/CN2019/091011 dated Sep. 11, 2019, pp. 1-2.
(Continued)

*Primary Examiner* — Linh V Nguyen
(74) *Attorney, Agent, or Firm* — McDonnell Boehnen Hulbert & Berghoff LLP

(57) ABSTRACT

A data compression method, comprising: obtaining a plurality of values of a parameter and an occurrence probability of each of the plurality of values (S101) comparing the occurrence probability with a predetermined threshold, wherein values with the occurrence probability less than the predetermined threshold are first set of values, and values with the occurrence probability greater than or equal to the predetermined threshold are second set of values (S102), performing pretreatment on the first set of values (S103), and encoding the second set of values and the pretreated first set of values (S104). By means of the data compression method, the maximum codeword length can be effectively reduced, so as to reduce the requirements of a code table to the storage space.

8 Claims, 4 Drawing Sheets

(58) Field of Classification Search
CPC .. H03M 13/6312; H03M 7/14; H03M 7/3071; H03M 7/42; H03M 7/6017; H03M 13/23; H03M 13/31; H03M 5/145; H03M 7/3084; H03M 7/46; H03M 7/3066; H03M 7/3088; H03M 7/70; H03M 7/6035; G06F 7/24; G06F 16/258; H04N 19/91; H04N 19/00; H04N 19/70; H04N 19/13; H04N 19/94; H04N 1/00472; H04N 1/41
USPC .......................................... 341/65, 67, 107
See application file for complete search history.

(56) References Cited

U.S. PATENT DOCUMENTS

| | | | | |
|---|---|---|---|---|
| 6,140,945 | A | 10/2000 | Yokose | |
| 6,265,997 | B1* | 7/2001 | Nomizu | H03M 7/4006 341/107 |
| 7,340,103 | B2* | 3/2008 | Smirnov | H04N 19/13 382/233 |
| 7,436,329 | B2* | 10/2008 | Lynch | H04N 19/61 375/E7.137 |
| 7,973,683 | B2* | 7/2011 | Choo | H03M 7/40 341/51 |
| 2007/0290899 | A1* | 12/2007 | Monro | H03M 7/40 341/51 |
| 2009/0322573 | A1* | 12/2009 | Southivong | H04N 19/91 341/51 |
| 2011/0150097 | A1* | 6/2011 | Boehm | H03M 7/40 341/67 |
| 2017/0180757 | A1* | 6/2017 | He | H03M 7/4018 |
| 2018/0351581 | A1* | 12/2018 | Presman | H03M 13/3746 |

FOREIGN PATENT DOCUMENTS

| | | |
|---|---|---|
| CN | 102438145 | 5/2012 |
| WO | 2007/149384 | 12/2007 |

OTHER PUBLICATIONS

International Written Opinion with Machine English Translation for PCT/CN2019/091011 dated Sep. 11, 2019, pp. 1-5.

* cited by examiner

DATA COMPRESSION METHOD AND APPARATUS, AND COMPUTER READABLE STORAGE MEDIUM

CROSS REFERENCE TO RELATED APPLICATION

This application is a U.S. National Phase of International Application No. PCT/CN2019/091011, filed Jun. 27, 2019, which claims priority to Chinese Patent Application No. 201810794662.9, filed Jul. 19, 2018, both of which are incorporated by reference herein in their entirety.

FIELD

The present disclosure relates to the field of data processing, and in particular, to a data compression method and a data compression device, and a computer-readable storage medium.

BACKGROUND

With the continuously improved computing and processing capabilities of various electronic devices and the increasing communication between electronic devices, the amount of data stored in electronic devices and transmitted between electronic devices has also increased continuously. One typical example is a neural network employed in the field of artificial intelligence. Currently, with the improved computing power and the increasingly complex problem to be solved as well as the gradually raised requirement on the performance of the neural network, the depth and scale of the deep neural network becomes greater and larger. A large-scale neural network corresponds to a large number of parameters, and the storage and transmission of such parameters are becoming a non-negligible problem, especially for edge computing. The deep neural network computes directly on a terminal, thus there are a large number of parameters stored in the terminal. The storage space for parameters affect greatly the cost of the neural network computer of the terminal (which may be in the form of a chip or other hardware/software). One main factor that affects the storage space for parameters is the maximum codeword length of an encoded parameter value, that is, the longer the maximum codeword length is, the larger the storage space required for storing the code table will be.

Therefore, there exists methods for compressing data (for example, various parameters) to be stored and/or transmitted in the neural network. Conventionally, one way is to reduce the unnecessary neuron connection in the neural network so as to reduce the number of parameters, but this may degrade the performance of the neural network. Another way is to quantize the parameters in the neural network, and compression encoding is further performed on the quantized parameters via some lossless compression encoding algorithms so as to improve the storage and transmission efficiencies of the parameters and reduce the requirement on the storage space. However, in this way, the size of the code table depends on the maximum codeword length, that is, the longer the maximum codeword length is, the larger the required storage space will be.

For example, Huffman encoding is taken as the lossless compression encoding algorithm. Huffman code is a variable-length code, that is, the codeword length corresponding to each encoded codeword is not always the same. Generally, the longest codeword length is longer than the original quantized code of the parameter, for example, for a quantized parameter with 16 bits, after Huffman encoding, the longest codeword length obtained may be over 20 bits, and the shortest codeword length may be 3 bits, but the average codeword length becomes shorter, for example, the average codeword length becomes 12 bits, which improves the encoding efficiency in comparison to the original quantized code, but also makes the decoding somewhat difficult.

Specifically, during Huffman decoding, the code table after encoding needs to be transferred to a decoder, and the decoder performs decoding via a lookup table (or, a similar search tree). For a coefficient with a large length originally, for example, a 16-bit coefficient, at least $2^{16}=64$ k table entries need to be stored, where each table entry at least needs to include: the 16-bit original data and the encoded codeword length, and if not extended, each table entry needs to further include the encoded codeword. In order to facilitate the implementation of the lookup table in hardware, the table often needs to be further extended according to the longest codeword length (that is, the highest bits of all the encoded codewords in the code table are aligned, and the insufficient ends are padded to the maximum codeword length, thus resulting in the excessive space required for the decoding table). For example, for the longest codeword length of 20, $2^{20}=1M$ table entries need to be stored. Therefore, in the prior art, a large storage space is required when the decoding is implemented in hardware.

However, in fact, for neural network parameters, the conventional lossless compression algorithm is not optimal and there is room for further optimization to reduce the maximum codeword length. Specifically, it is found by analyzing a large number of neural network parameters that the probability distribution of the original values or quantized values of the parameters is similar to a normal distribution, that is, there exists large differences between the occurrence probabilities (or occurrence times) corresponding to the original values of the parameters, which provides the possibility for further compression of the parameter value codes, that is, further reducing the maximum codeword length in comparison to the conventional lossless compression encoding algorithm.

SUMMARY

In order to solve the above problem of excessive storage space required for a code table due to too long maximum codeword length after encoding, the present disclosure proposes a data compression method and a data compression device, which can control and shorten the maximum codeword length, thereby reducing the storage space required for the code table.

According to a first aspect of the disclosure, there provides a data compression method, which includes:

obtaining a plurality of values of a parameter and respective occurrence probabilities of the plurality of values;

comparing the respective occurrence probabilities with a predetermined threshold, wherein a part from the plurality of values with the respective occurrence probabilities less than the predetermined threshold are taken as a first set of values, and the other part from the plurality of values with the respective occurrence probabilities greater than or equal to the predetermined threshold are taken as a second set of values;

preprocessing the first set of values; and encoding the second set of values and the preprocessed first set of values.

Here, the predetermined threshold may be specifically determined by one skilled in the art according to practical application scenarios. In general, the larger the predetermined threshold is, the larger the number of the first set of values will be, and the more apparent the reduction effect on the maximum codeword length will be, but the more the overall encoding efficiency may be affected; on the contrary, the smaller the predetermined threshold is, the smaller the number of the first set of values will be, and the smaller the reduction effect on the maximum codeword length, but the less the overall encoding efficiency may be affected.

Additionally, the purpose of preprocessing and then encoding the first set of values is to reduce the encoded codeword length of this set of values.

Preferably, preprocessing the first set of values may include: obtaining respective original encoded codewords of the first set of values.

Preferably, encoding the second set of values and the preprocessed first set of values may include:

performing variable length encoding on the second set of values, and obtaining respective encoded codewords of the second set of values; and padding with one of 0 and 1 the end of the shortest encoded codeword from the encoded codewords obtained by the variable length encoding to obtain a padded codeword of a value corresponding to the shortest encoded codeword, and padding with the other of 0 and 1 the end of the shortest encoded codeword from the encoded codewords obtained by the variable length encoding to obtain a prefix, and combining the prefix with the obtained original encoded codeword of each value in the first set of values to obtain a combined codeword of each value in the first set of values.

Preferably, the above method may further include: forming a code table, wherein the code table may at least includes: each value in the first set of values and their respective combined codewords; and each value in the second set of values and their respective encoded codewords or padded codewords.

Preferably, the method may further include: when decoding an input bitstream according to the code table, if the prefix is obtained from the decoding, taking and outputting preset N bits following the prefix in the input bitstream as an original encoded codeword, wherein the N may be the length of the original encoded codeword. The length N of the original encoded codeword is preferably a natural number greater than 2, and the larger N is, the more apparent the advantages of data compression method of the disclosure will be.

Preferably, preprocessing the first set of values may include: setting the respective occurrence probabilities of the first set of values so that: a sum of the respective occurrence probabilities of the first set of values is no greater than a second minimum value in the second set of values, and the first set of values can form a balanced binary tree. More preferably, preprocessing the first set of values may include: calculating an average value of the respective occurrence probabilities of the first set of values, and setting the respective occurrence probabilities of the first set of values as equal to each other and less than or equal to the average value. Here, the preprocessing intends to make the encoded codeword length of the first set of values more uniform.

Preferably, encoding the second set of values and the preprocessed first set of values includes:

performing variable length encoding on the second set of values and the preprocessed first set of values together.

Preferably, the variable length encoding may be Shannon encoding, Feno encoding or Huffman encoding.

According to a second aspect of the disclosure, there provides a data compression device, which includes an obtaining unit, a comparing unit, a preprocessing unit and an encoding unit, wherein the obtaining unit is connected with the comparing unit, the comparing unit is connected with the preprocessing unit and the encoding unit, and the preprocessing unit is connected with the encoding unit, wherein:

the obtaining unit is configured to obtain a plurality of values of a parameter and respective occurrence probabilities of the plurality of values;

the comparing unit is configured to compare the respective occurrence probabilities obtained by the obtaining unit with a predetermined threshold, and divide the plurality of values obtained from the obtaining unit into a first set of values with the respective occurrence probabilities less than the predetermined threshold, and a second set of values with the respective occurrence probabilities greater than or equal to the predetermined threshold;

the preprocessing unit is configured to preprocess the first set of values obtained from the comparing unit; and the encoding unit is configured to encode the second set of values obtained from the comparing unit and the first set of values preprocessed by the preprocessing unit.

Here, the predetermined threshold may be specifically determined by one skilled in the art according to practical application scenarios. In general, the larger the predetermined threshold is, the larger the number of the first set of values will be, and the more apparent the reduction effect on the maximum codeword length will be, but the more the overall encoding efficiency may be affected; on the contrary, the smaller the predetermined threshold is, the smaller the number of the first set of values will be, and the smaller the reduction effect on the maximum codeword length, but the less the overall encoding efficiency may be affected.

Additionally, the purpose of preprocessing and then encoding the first set of values is to reduce the encoded codeword length of this set of values.

Preferably, the preprocessing includes obtaining respective original encoded codewords of the first set of values.

Preferably, the encoding performed by the encoding unit may include:

performing variable length encoding on the second set of values, and obtaining respective encoded codewords in the second set of values; and padding with one of 0 and 1 the end of the shortest encoded codeword from the encoded codewords obtained by the variable length encoding to obtain a padded codeword of a value corresponding to the shortest encoded codeword, and padding with the other of 0 and 1 the end of the shortest encoded codeword from the encoded codewords obtained by the variable length encoding to obtain a prefix, and combining the prefix with the obtained original encoded codeword of each value in the first set of values to obtain a combined codeword of each value in the first set of values.

Preferably, the encoding unit is further configured to form a code table, wherein the code table at least includes: each value in the first set of values and their respective combined codewords; and each value in the second set of values and their respective encoded codewords or padded codewords.

Preferably, preprocessing the first set of values by the preprocessing unit includes:

setting the respective occurrence probabilities of each value in the first set of values so that: a sum of the respective occurrence probabilities of the first set of values is no greater than a second minimum value in the second set of values, and the first set of values can form a balanced binary tree.

Preferably, the preprocessing unit may be further configured to:

calculate an average value of the respective occurrence probabilities of the first set of values, and set the respective occurrence probabilities of the first set of values as equal to each other and less than or equal to the average value.

Preferably, the encoding unit may be further configured to: perform variable length encoding on the second set of values and the preprocessed first set of values together.

Preferably, the variable length encoding is Shannon encoding, Feno encoding or Huffman encoding.

According to another aspect of the disclosure, there further provides a computer-readable storage medium, which has a computer instruction stored therein, wherein, when executed by a processor, the computer instruction may implement the above method.

By the above solution, a part of the codewords with the minimum probability before being encoded according to the disclosure are preprocessed so as to achieve the effect of reducing the maximum encoded codeword length. Because the occurrence probabilities of a part of the values of the parameters of an artificial neural network is much less than the remaining part of values, the processing on this part of values affects the compression efficiency less, while significantly reducing the complexity and implementation cost of decoding, especially the cost of the storage space.

It should be understood that, the above illustration is merely a summary of the technical solutions of the disclosure for facilitating clearly understanding of the technical means of the disclosure and thus implementing of the disclosure according to the contents of the specification. In order to make the above and other objects, characteristics, features and advantages of the disclosure more apparent, detailed description of the embodiments of the disclosure will be illustrated below by examples.

BRIEF DESCRIPTION OF THE DRAWINGS

By reading the detailed description of the exemplary embodiments below, those of ordinary skill in the art will understand the advantages and benefits described herein and other advantages and benefits. The drawings are only for the purpose of illustrating exemplary embodiments, and shall not be considered as any limitation to the present disclosure. Moreover, the same reference signs are used to denote the same components throughout the description.

DETAILED DESCRIPTION OF THE EMBODIMENTS

Figure 1:
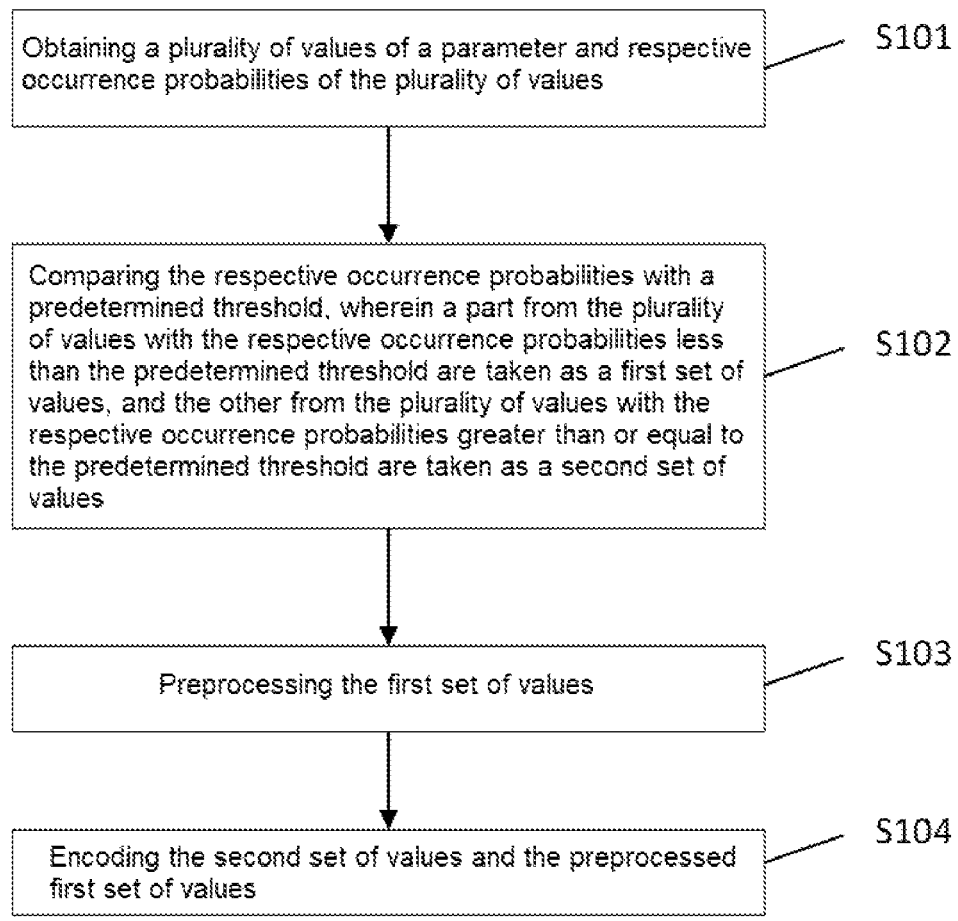
FIG. 1 is a schematic flow chart of a data compression method according to one embodiment of the disclosure.

Exemplary embodiments of the disclosure will be described below in more detail in conjunction with the drawings. Although exemplary embodiments of the disclosure are shown in the drawings, it should be understood that the disclosure may be implemented in various forms, rather than being limited to the embodiments illustrated here. On the contrary, these embodiments are provided for more thoroughly understanding the disclosure and fully conveying the scope of the disclosure to one skilled in the art.

In the disclosure, it should be understood that, terms such as "include" or "have" intends to indicate the existence of a characteristic, a number, a step, an action, a component, a part disclosed in the specification or any combination thereof, without excluding the possibility of the existence of one or more other characteristics, numbers, steps, actions, components, parts or any combination thereof.

Additionally, it should be noted that, in the case of no conflict, the embodiments in the disclosure and the characteristics in the embodiments may be combined with each other. The disclosure will be illustrated in detail below by referring to the drawings and in conjunction with the embodiments.

In FIG. 1, it shows a schematic flow chart of a data compression method according to one embodiment of the disclosure. The data compression method includes:

S101: a plurality of values of a parameter and respective occurrence probabilities of the plurality of values are obtained;

S102: the respective occurrence probabilities are compared with a predetermined threshold, wherein a part from the plurality of values with the respective occurrence probabilities less than the predetermined threshold are taken as a first set of values, and the other from the plurality of values with the respective occurrence probabilities greater than or equal to the predetermined threshold are taken as a second set of values;

S103: the first set of values is preprocessed; and

S104: the second set of values and the preprocessed first set of values are encoded.

Here, the type of the parameter is not specifically defined, and it may be various parameters, for example, various parameters in an artificial neural network (for example, parameters concerned in convolution calculation), or parameters in other mathematical models or algorithms; the level of efficiency achieved by the data compression method according to the embodiments of the disclosure is positively correlated with the differences between the probability distributions of the values of respective parameters.

In this application, illustration is given by taking parameters in an artificial neural network as an example, but it is not limited to the parameters in the artificial neural network. In the embodiments of the disclosure, the parameter values are not processed in a uniform mode as in conventional way; instead, the parameter values are grouped, and values in different groups are processed differently, so that the maximum codeword length may be controlled and shortened, thereby reducing the storage space required for the code table.

It may be understood by one skilled in the art that, the larger the predetermined threshold is, the more the number of values in the first set of values will be, and the more apparent the reduction effect on the maximum codeword length will be, but the more the overall encoding efficiency may be affected; on the contrary, the smaller the predetermined threshold is, the less the number of values in the first set of values will be, and the smaller the reduction effect on the maximum codeword length, but the less the overall encoding efficiency may be affected.

Additionally, the purpose of preprocessing and then encoding the first set of values is to reduce the encoded codeword length of this set of values.

Figure 2:
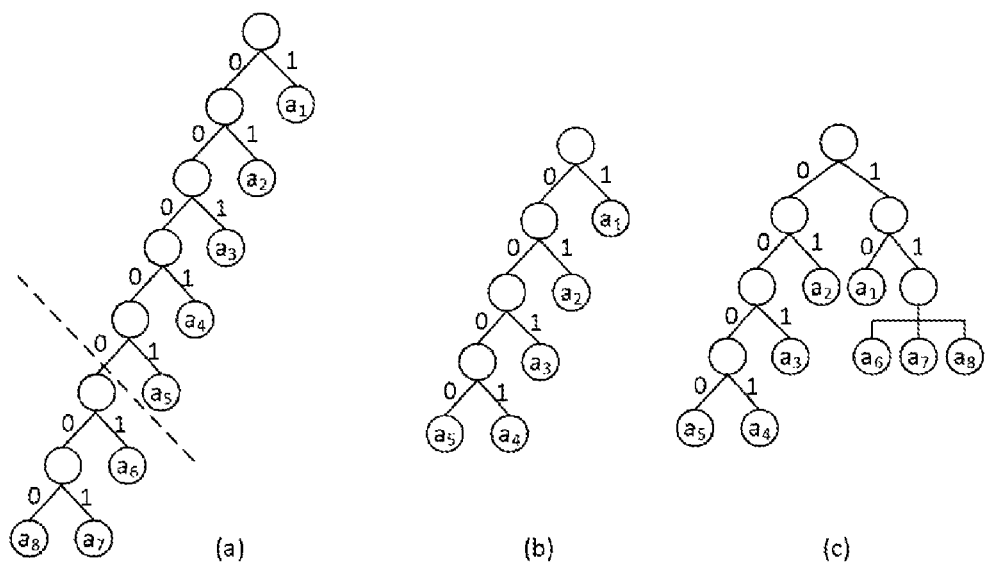
FIG. 2 is an example of a data compression method according to another embodiment of the disclosure, wherein (a) shows an example employing conventional Huffman encoding, while (b) and (c) show examples employing the method according to the embodiment of the disclosure.
Figure 3:
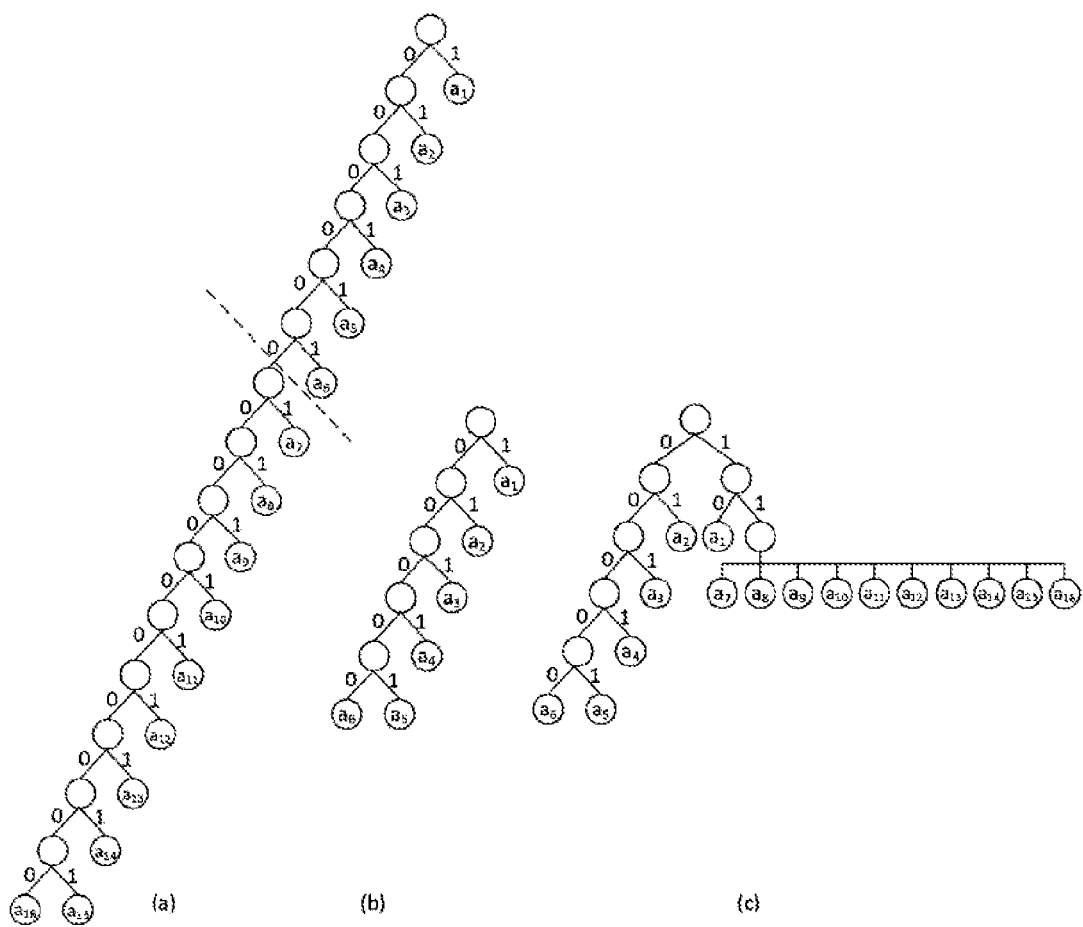
FIG. 3 is another example of a data compression method according to another embodiment of the disclosure, wherein (a) shows an example employing conventional Huffman encoding, while (b) and (c) show examples employing the method according to the embodiment of the disclosure.

The embodiments of the disclosure will be further described below in conjunction with FIG. 2 and FIG. 3. FIG. 2 shows an example of the data compression method according to another embodiment of the disclosure, wherein (a) shows an example employing conventional Huffman encoding, while (b) and (c) show examples employing the method according to the embodiment of the disclosure; FIG. 3 shows another example of a data compression method according to another embodiment of the disclosure, wherein (a) shows an example employing conventional Huffman encoding, while (b) and (c) show examples employing the method according to the embodiment of the disclosure.

As shown in FIG. 2, in this example, parameter A before being encoded has the original encoded codeword length N of 3 bits (for example, quantized encoding is performed on the parameter A by 3 bits), it has 8 values of $a_1$, $a_2$, $a_3$, $a_4$, $a_5$, $a_6$, $a_7$ and $a_8$, which respectively have original encoded codewords of 000, 001, 010, 011, 100, 101, 110 and 111, and the corresponding occurrence probabilities are respectively 1/2, 1/4, 1/8, 1/16, 1/32, 1/64, 1/128 and 1/128. As shown by (a) in the drawing, if conventional Huffman encoding is employed, although the obtained shortest encoded codeword length is only 1, i.e., the encoded codeword corresponding to value $a_1$ is 1, the obtained maximum encoded codeword length reaches 7 bits, i.e., in view of the encoded codeword 0000001 corresponding to value $a_7$ and the encoded codeword 0000000 corresponding to value $a_8$.

In the case that the data compression method according to the embodiments of the disclosure is employed, as shown by (b) and (c) in FIG. 2, provided that the predetermined threshold is 1/48, after the probabilities 1/2, 1/4, 1/8, 1/16, 1/32, 1/64, 1/128, 1/128 of the values $a_1$, $a_2$, $a_3$, $a_4$, $a_5$, $a_6$, $a_7$, $a_8$ are compared with the predetermined threshold in the above step S102, the 8 values of the parameter A are divided into two sets, i.e., the first set of values $a_6$, $a_7$, $a_8$ and the second set of values $a_1$, $a_2$, $a_3$, $a_4$, $a_5$. Next, the first set of values $a_6$, $a_7$, $a_8$ are preprocessed to obtain the respective original encoded codewords 101, 110, 111 of the first set of values $a_6$, $a_7$, $a_8$. At the same time, as shown by (b) in FIG. 2, variable length encoding, for example, Huffman encoding, is performed on the second set of values $a_1$, $a_2$, $a_3$, $a_4$, $a_5$, to obtain respective encoded codewords 1, 01, 001, 0001, 0000 corresponding to the second set of values $a_1$, $a_2$, $a_3$, $a_4$, $a_5$. Additionally, the end of the shortest encoded codeword 1 in the obtained encoded codewords is padded with 0 to obtain a padded codeword 10 of the value $a_1$ corresponding to the shortest encoded codeword, and the end of the shortest encoded codeword 1 is padded with 1 to obtain a prefix 11, and the prefix 11 is combined with the obtained original encoded codewords 101, 110, 111 of the first set of values $a_6$, $a_7$, $a_8$ to obtain 11101, 11110, 11111 respectively to obtain the combined codewords the first set of values $a_6$, $a_7$, $a_8$, as shown by (c) in FIG. 2. Thus, the length of the longest encoded codeword finally obtained in the embodiment of the disclosure is 5, which is less than the length 7 of the longest encoded codeword corresponding to conventional encoding.

The code table formed in the data compression method in this embodiment is as shown in Table 1 below. The code table may at least include: each value in the first set of values, and their respective combined codewords; each value in the second set of values, and their respective encoded codewords or padded codewords.

TABLE 1

| Encoded codewords | Values before being encoded | Codeword lengths |
| --- | --- | --- |
| 10 | $a_1$ | 2 |
| 01 | $a_2$ | 2 |
| 001 | $a_3$ | 3 |
| 0001 | $a_4$ | 4 |
| 0000 | $a_5$ | 4 |
| 11101 | $a_6$ | 5 |
| 11110 | $a_7$ | 5 |
| 11111 | $a_8$ | 5 |

However, in the above mode for obtaining the prefix, the end of the shortest encoded codeword 1 in the obtained encoded codewords of the second set of values $a_1$, $a_2$, $a_3$, $a_4$, $a_5$ may be padded with 1 to obtain the padded codeword 11 of the value $a_1$ corresponding to the shortest encoded codeword, and the end of the shortest encoded codeword 1 may be padded with 0 to obtain the prefix 10, and the prefix 10 is combined with the original encoded codewords 101, 110, 111 of the first set of values $a_6$, $a_7$, $a_8$ to obtain 10101, 10110, 10111 respectively to obtain the respective combined codewords the first set of values $a_6$, $a_7$, $a_8$.

When an input bitstream is decoded according to the obtained code table, if the prefix is obtained from the decoding, preset N bits following the prefix in the input bitstream are taken as an original encoded codeword for outputting, wherein N is the length of the original encoded codeword. The original encoded codeword length N is preferably a natural number greater than 2, and the larger N is, the more apparent the advantages of data compression method of the disclosure will be.

In another example, as shown in FIG. 3, parameter A before being encoded has the original encoded codeword length N of is 4 bits (for example, quantized encoding is performed on the parameter A by 4 bits), and it has 16 values of $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, $a_{15}$, $a_{16}$, which respectively have original encoded codewords of 0000, 0001, 0010, 0011, 0100, 0101, 0110, 0111, 1000, 1001, 1010, 1011, 1100, 1101, 1110, 1111, and the corresponding occurrence probabilities are respectively 1/2, 1/4, 1/8, 1/16, 1/32, 1/64, 1/128, 1/256, 1/512, 1/1024, 1/2048, 1/4096, 1/8192, 1/16384, 1/32768, 1/32768. As shown by (a) in FIG. 3, if conventional Huffman encoding is employed, although the obtained shortest encoded codeword length is only 1, i.e., the encoded codeword corresponding to value a1 is 1, the obtained maximum encoded codeword length reaches 15 bits, i.e., in view of the encoded codeword 000000000000001 corresponding to value $a_{15}$ and the encoded codeword 000000000000000 corresponding to value $a_{16}$.

In the case that the data compression method according to the embodiments of the disclosure is employed, as shown by (b) and (c) in FIG. 3, provided that the predetermined threshold is 1/72, after the probabilities of values $a_1$, $a_2$, $a_3$, $a_4$, $a_5$, $a_6$, $a_7$, $a_8$, $a_9$, $a_{10}$, $a_{11}$, $a_{12}$, $a_{13}$, $a_{14}$, $a_{15}$, $a_{16}$ are compared with the predetermined threshold in the above step S102, the 16 values of the parameter A are divided into two sets, i.e., the first set of values $a_7$, $a_8$, $a_9$, $a_{10}$, $a_{11}$, $a_{12}$, $a_{13}$, $a_{14}$, $a_{15}$, $a_{16}$ and the second set of values $a_1$, $a_2$, $a_3$, $a_4$, $a_5$, $a_6$.

Next, the first set of values $a_7$, $a_8$, $a_9$, $a_{10}$, $a_{11}$, $a_{12}$, $a_{13}$, $a_{14}$, $a_{15}$, $a_{16}$ are preprocessed to obtain the original encoded codewords 0110, 0111, 1000, 1001, 1010, 1011, 1100, 1101, 1110, 1111 of the first set of values $a_7$, $a_8$, $a_9$, $a_{10}$, $a_{11}$, $a_{12}$, $a_{13}$, $a_{14}$, $a_{15}$, $a_{16}$. At the same time, as shown by (b) in FIG. 3, variable length encoding, for example, Huffman encoding, is performed on the second set of values $a_1$, $a_2$, $a_3$, $a_4$, $a_5$, $a_6$ to obtain respective encoded codewords 1, 01, 001, 0001, 00001, 00000 corresponding to the second set of values $a_1$, $a_2$, $a_3$, $a_4$, $a_5$, $a_6$. Additionally, the end of the shortest encoded codeword 1 in the obtained encoded codewords is padded with 0 to obtain a padded codeword 10 of the value a1 corresponding to the shortest encoded codeword, and the end of the shortest encoded codeword 1 is padded with 1 to obtain a prefix 11, and the prefix 11 is combined with the obtained original encoded codewords 0110, 0111, 1000, 1001, 1010, 1011, 1100, 1101, 1110, 1111 of the first set of values $a_7$, $a_8$, $a_9$, $a_{10}$, $a_{11}$, $a_{12}$, $a_{13}$, $a_{14}$, $a_{15}$, $a_{16}$ to obtain 110110, 110111, 111000, 111001, 111010, 111011, 111100, 111101, 111110, 111111 respectively to obtain the respective combined codewords of the first set of values, as shown by (c) in FIG. 3. Thus, the length of the longest encoded codeword finally obtained in the embodiment of the disclosure is 6, which is apparently less than the length 15 of the longest encoded codeword corresponding to conventional encoding.

The code table formed in the data compression method in this embodiment is as shown in Table 2. The code table may at least include: each value in the first set of values, and their respective combined codewords; each value in the second set of values, and their respective encoded codewords or padded codewords.

TABLE 2

| Encoded codewords | Values before being encoded | Codeword lengths |
|---|---|---|
| 10 | $a_1$ | 2 |
| 01 | $a_2$ | 2 |
| 001 | $a_3$ | 3 |
| 0001 | $a_4$ | 4 |
| 00001 | $a_5$ | 5 |
| 00000 | $a_6$ | 5 |
| 110110 | $a_7$ | 6 |
| 110111 | $a_8$ | 6 |
| 111000 | $a_9$ | 6 |
| 111001 | $a_{10}$ | 6 |
| 111010 | $a_{11}$ | 6 |
| 111011 | $a_{12}$ | 6 |
| 111100 | $a_{13}$ | 6 |
| 111101 | $a_{14}$ | 6 |
| 111110 | $a_{15}$ | 6 |
| 111111 | $a_{16}$ | 6 |

Figure 4:
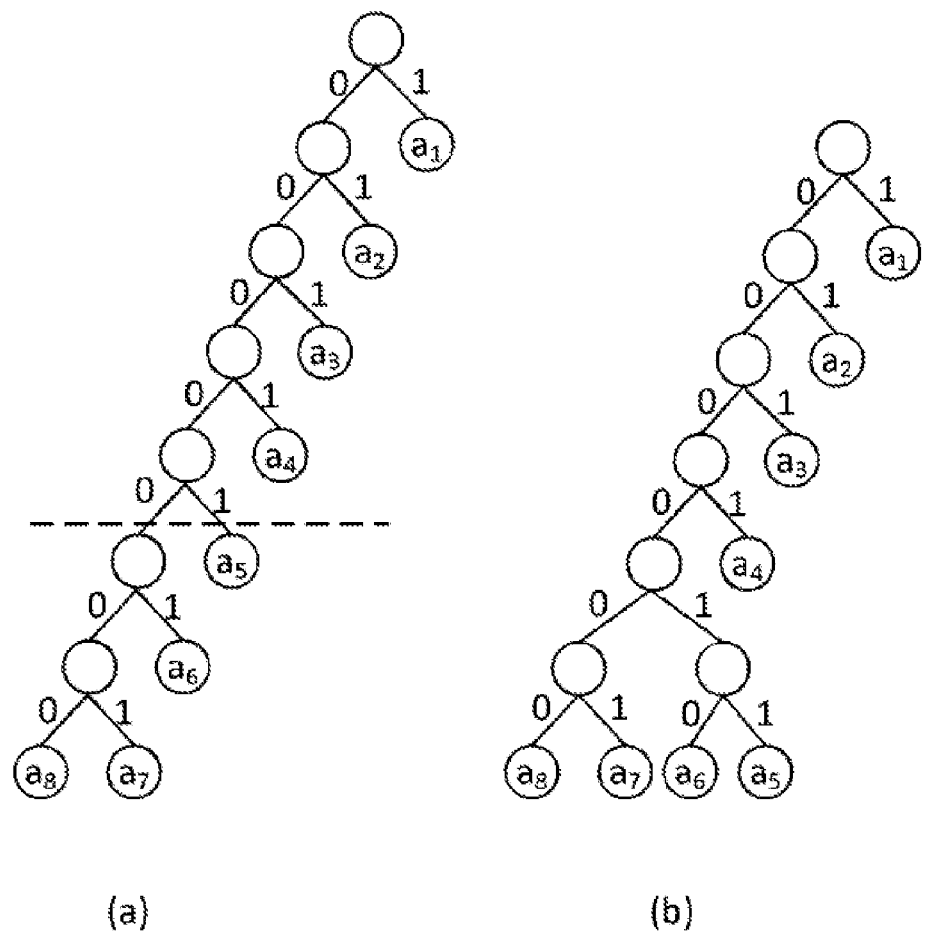
FIG. 4 is an example of the data compression method according to still another embodiment of the disclosure, wherein (a) shows an example employing conventional Huffman encoding, while (b) shows an example employing the method according to the embodiment of the disclosure.

FIG. 4 shows an example of the data compression method according to still another embodiment of the disclosure, wherein (a) shows an example employing conventional Huffman encoding, while (b) shows an example employing the method according to the embodiment of the disclosure.

As shown in the example of FIG. 4, parameter A before being encoded according to the disclosure has the original encoded codeword length N of 3 bits (for example, quantized encoding is performed on the parameter A by 3 bits), and it has 8 values of $a_1$, $a_2$, $a_3$, $a_4$, $a_5$, $a_6$, $a_7$, $a_8$, which respectively have original encoded codewords of 000, 001, 010, 011, 100, 101, 110, 111, and the corresponding occurrence probabilities are respectively 1/2, 1/4, 1/8, 1/16, 1/32, 1/64, 1/128, 1/128. As shown by (a) in the drawing, if conventional Huffman encoding is employed, although the encoded shortest codeword length obtained is only 1, i.e., the encoded codeword corresponding to value a1 is 1, the encoded maximum codeword length obtained reaches 7 bits, i.e., in view of the encoded codeword 0000001 corresponding to value a7 and the encoded codeword 0000000 corresponding to value $a_8$.

In the case that the data compression method according to the embodiments of the disclosure is employed, as shown by (b) in FIG. 4, provided that the predetermined threshold is 1/24, after the probabilities of values $a_1$, $a_2$, $a_3$, $a_4$, $a_5$, $a_6$, $a_7$, $a_8$ are compared with the predetermined threshold in the above step S102, the 8 values of the parameter A are divided into two sets, i.e., the first set of values $a_5$, $a_6$, $a_7$, $a_8$ and the second set of values $a_1$, $a_2$, $a_3$, $a_4$. Next, the first set of values $a_5$, $a_6$, $a_7$, $a_8$ are preprocessed to reset the respective occurrence probabilities thereof, so that the sum of the respective occurrence probabilities of the first set of values $a_5$, $a_6$, $a_7$, $a_8$ is no greater than 1/8 of the second minimum value in the second set of values $a_1$, $a_2$, $a_3$, $a_4$, and the first set of values can form a balanced binary tree, so as to avoid that the codeword lengths obtained by re-encoding the first set of values are not uniform enough and thus there exist great differences between each other. More preferably, preprocessing the first set of values $a_1$, $a_2$, $a_3$, $a_4$ may include: calculating an average value of the respective occurrence probabilities of the first set of values $a_1$, $a_2$, $a_3$, $a_4$, and setting the respective occurrence probabilities of the first set of values $a_1$, $a_2$, $a_3$, $a_4$ as equal to each other and less than or equal to the average value. Thus, the codeword lengths obtained after encoding the first set of values $a_1$, $a_2$, $a_3$, $a_4$ can be more uniform.

Next, the second set of values $a_5$, $a_6$, $a_7$, $a_8$, and the first set of values $a_1$, $a_2$, $a_3$, $a_4$ with reset occurrence probabilities are encoded together, for example, by variable length encoding, as shown by (b) in FIG. 4. The code table formed in the data compression method in this embodiment is as shown in Table 3. The code table may at least include: each value in the first set of values, and their respective combined codewords; each value in the second set of values, and their respective encoded codewords or padded codewords.

TABLE 3

| Encoded codewords | Values before being encoded | Codeword lengths |
|---|---|---|
| 1 | $a_1$ | 1 |
| 01 | $a_2$ | 2 |
| 001 | $a_3$ | 3 |
| 0001 | $a_4$ | 4 |
| 000011 | $a_5$ | 6 |
| 000010 | $a_6$ | 6 |
| 000001 | $a_7$ | 6 |
| 000000 | $a_8$ | 6 |

Thus, the length of the longest encoded codeword finally obtained in this example is 6, which is less than the length 7 of the longest encoded codeword corresponding to conventional encoding.

Here, the variable length encoding may be Shannon encoding, Feno encoding or Huffman encoding, or other encoding schemes.

Figure 5:
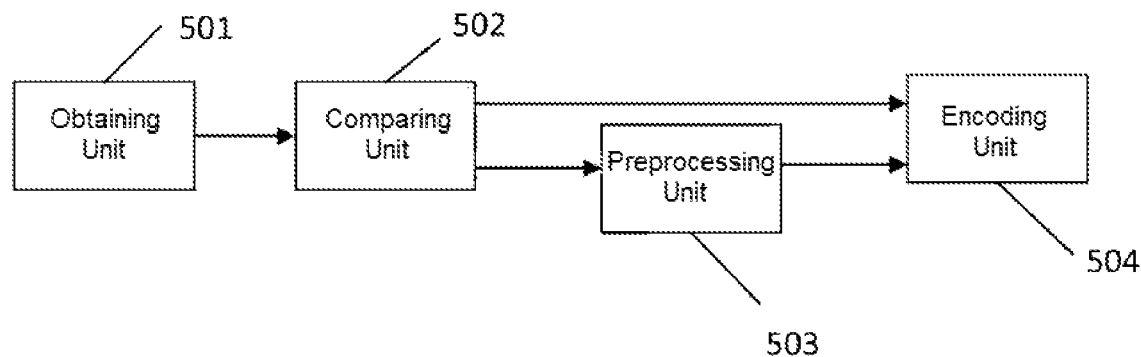
FIG. 5 is a schematic diagram of a data compression device according to still another embodiment of the disclosure.

A data compression device for implementing the above data compression method will be described below in conjunction with FIG. 5. As shown in FIG. 5, it shows a schematic diagram of a data compression device 500 according to still another embodiment of the disclosure. The data compression device 500 includes: an obtaining unit 501, a comparing unit 502, a preprocessing unit 503 and an encoding unit 504, wherein the obtaining unit 501 is connected with the comparing unit 502, the comparing unit 502 is connected with the preprocessing unit 503 and the encoding unit 504, and the preprocessing unit 503 is connected with the encoding unit 504.

Wherein, the obtaining unit 501 is configured to obtain a plurality of values of a parameter and respective occurrence probabilities of the plurality of values;

the comparing unit 502 is configured to compare the respective occurrence probabilities obtained by the obtaining unit 501 with a predetermined threshold, and divide the plurality of values obtained from the obtaining unit 502 into a first set of values with the respective occurrence probabilities less than the predetermined threshold and a second set of values with the respective occurrence probabilities greater than or equal to the predetermined threshold;

the preprocessing unit 503 is configured to preprocess the first set of values obtained from the comparing unit 502; and the encoding unit 504 is configured to encode the second set of values obtained from the comparing unit 502 and the first set of values preprocessed by the preprocessing unit 503.

Here, the predetermined threshold may be specifically determined by one skilled in the art according to practical application scenarios. In general, the larger the predetermined threshold is, the larger the number of the first set of values will be, and the more apparent the reduction effect on the maximum codeword length will be, but the more the overall encoding efficiency may be affected; on the contrary, the smaller the predetermined threshold is, the smaller the number of the first set of values will be, and the smaller the reduction effect on the maximum codeword length, but the less the overall encoding efficiency may be affected.

Additionally, the purpose of preprocessing and then encoding the first set of values is to reduce the encoded codeword length of this set of values.

In a specific example, the preprocessing may include obtaining respective original encoded codewords of the first set of values.

The encoding by the encoding unit 504 may include:

performing variable length encoding on the second set of values to obtain respective encoded codewords of the second set of values; and padding with one of 0 and 1 the end of the shortest encoded codeword from the encoded codewords obtained by variable length encoding to obtain a padded codeword of the value corresponding to the shortest encoded codeword, and padding with the other of 0 and 1 the end of the shortest encoded codeword from the encoded codewords obtained by the variable length encoding to obtain a prefix, and combining the prefix with the obtained original encoded codeword of each value in the first set of values to obtain a combined codeword of each value in the first set of values.

Additionally, the encoding unit 504 may be further configured to form a code table, wherein the code table at least includes: each value in the first set of values, and their respective combined codewords; and each value in the second set of values, and their respective encoded codewords or padded codewords.

In another specific example, preprocessing the first set of values by the preprocessing unit 503 includes:

setting the respective occurrence probabilities of in the first set of values, so that: the sum of the respective occurrence probabilities of the first set of values is no greater than the second minimum value in the second set of values, and the first set of values can form a balanced binary tree.

Or, the preprocessing unit 503 may be further configured to:

calculate an average value of the respective occurrence probabilities of the first set of values, and set the respective occurrence probabilities of the first set of values as equal to each other and less than or equal to the average value.

The encoding unit 504 may be further configured to: perform variable length encoding on the second set of values and the preprocessed first set of values together.

Variable length encoding may be Shannon encoding, Feno encoding or Huffman encoding, or other encoding mode.

Figure 6:
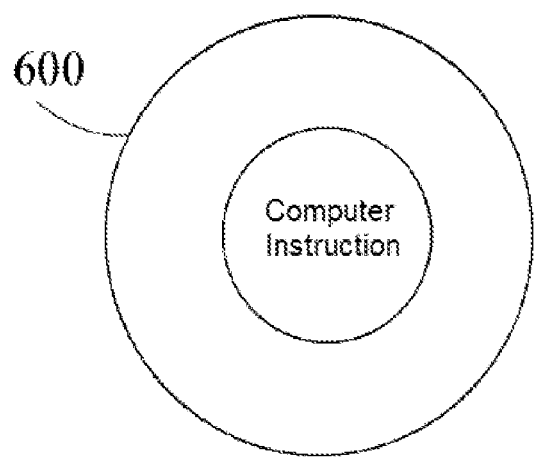
FIG. 6 is a schematic diagram of a computer-readable storage medium according to one embodiment of the disclosure.

According to another embodiment of the disclosure, there further provides a computer-readable storage medium. As shown in FIG. 6, it shows a schematic diagram of a computer-readable storage medium 600 according to one embodiment of the disclosure, which has a computer instruction stored therein. When executed by a processor, the computer instruction may implement the above data compression method. The computer-readable storage medium 600 may be a portable compact disc read-only memory (CD-ROM). However, the computer-readable storage medium 600 of the disclosure is not limited hereto, and in this document, the computer-readable storage medium may be any tangible medium containing or storing a computer instruction.

By the above solution, a part of the codewords with the minimum probability before being encoded according to the disclosure are preprocessed so as to achieve the effect of reducing the maximum encoded codeword length. Because the occurrence probabilities of a part of the values of the parameters of an artificial neural network is much less than the remaining part of values, the processing on this part of values affects the compression efficiency less, while significantly reducing the complexity and implementation cost of decoding, especially the cost of the storage space.

The flowcharts and block diagrams in the drawings show some implementable architectures, functions and operations of the method, device and computer-readable storage medium according to various embodiments of the disclosure. It should be noted that, the steps represented by each block in the flowchart are not necessarily carried out in the order shown by the labels, and the steps sometimes may be carried out substantially in parallel, and sometimes may be carried out in a reverse order, which is determined by the function concerned. It should be further noted that, each block in the block diagrams and/or the flowcharts and a combination of the blocks in the block diagrams and/or the flowcharts may be implemented by hardware for executing a specified function or operation, or may be implemented by a combination of hardware and a computer instruction.

The units or modules concerned in the embodiments described in the disclosure may be implemented in software or in hardware.

From the above description of the embodiments, one skilled in the art may clearly understand that each embodiment may be implemented with the aid of software plus a necessary general hardware platform, and of course, each embodiment may be implemented via hardware. Based on such an understanding, the essential part of the technical solutions in the embodiments of the disclosure, or in other words, the part that contributes to the prior art, may be embodied in the form of a software product that is stored in a computer-readable storage medium, for example, ROM/RAM, magnetic disc or compact disc, etc., and includes several instructions that can make a computer device (which may be a personal computer, a server or a network device, etc.) implement the method according to each embodiment or some parts of the embodiment.

Finally, it should be noted that, the above embodiments are merely provided for illustrating, rather than limiting, the technical solutions of the disclosure. Although the disclosure has been illustrated in detail referring to the above embodiments, it should be understood by one of ordinary skills in the art that, the technical solutions recorded in each of the above embodiments may still be modified, or a part of the technical features may be equivalently substituted; however, these modifications or substitutions will not make the corresponding technical solutions depart from the spirit and scope of the technical solutions in each embodiment of the disclosure.

What is claimed is:

1. A data compression method, comprising:
    obtaining a plurality of values of a parameter and respective occurrence probabilities of the plurality of values;
    comparing the respective occurrence probabilities with a predetermined threshold, to divide the plurality of values into a first set of values with the respective occurrence probabilities less than the predetermined threshold and a second set of values with the respective occurrence probabilities greater than or equal to the predetermined threshold;
    preprocessing the first set of values; and
    encoding the second set of values and the preprocessed first set of values,
    wherein the preprocessing the first set of values comprises obtaining respective original encoded codewords of the first set of values, and
    the encoding the second set of values and the preprocessed first set of values comprises:
    performing variable length encoding on the second set of values, and obtaining respective encoded codewords of the second set of values; and
    padding with one of 0 and 1 the end of the shortest encoded codeword from the encoded codewords obtained by the variable length encoding to obtain a padded codeword of a value corresponding to the shortest encoded codeword, and padding with the other of 0 and 1 the end of the shortest encoded codeword from the encoded codewords obtained by the variable length encoding to obtain a prefix, and combining the prefix with the obtained respective original encoded codewords of the first set of values to obtain respective combined codewords of the first set of values.

2. The data compression method according to claim 1, further comprising:
    forming a code table, which at least comprises: each value in the first set of values, and their respective combined codewords; each value in the second set of values, and their respective encoded codewords or padded codewords.

3. The data compression method according to claim 2, further comprising:
    when decoding an input bitstream according to the code table, if the prefix is obtained from the decoding, taking and outputting preset N bits following the prefix in the input bitstream as an original encoded codeword.

4. The data compression method according to claim 1, wherein the variable length encoding is Shannon encoding, Feno encoding or Huffman encoding.

5. A data compression device, comprising: an obtaining unit, a comparing unit, a preprocessing unit and an encoding unit, wherein the obtaining unit is connected with the comparing unit, the comparing unit is connected with the preprocessing unit and the encoding unit, and the preprocessing unit is connected with the encoding unit, wherein:
    the obtaining unit is configured to obtain a plurality of values of a parameter and respective occurrence probabilities of the plurality of values;
    the comparing unit is configured to compare the respective occurrence probabilities obtained by the obtaining unit with a predetermined threshold, and divide the plurality of values obtained from the obtaining unit into a first set of values with the respective occurrence probabilities less than the predetermined threshold, and a second set of values with the respective occurrence probabilities greater than or equal to the predetermined threshold;
    the preprocessing unit is configured to preprocess the first set of values obtained from the comparing unit; and
    the encoding unit is configured to encode the second set of values obtained from the comparing unit and the first set of values preprocessed by the preprocessing unit,
    wherein the preprocessing comprises obtaining respective original encoded codewords of the first set of values, and
    the encoding performed by the encoding unit comprises:
    performing variable length encoding on the second set of values, and obtaining respective encoded codewords of the second set of values; and
    padding with one of 0 and 1 the end of the shortest encoded codeword from the encoded codewords obtained by the variable length encoding to obtain a padded codeword of a value corresponding to the shortest encoded codeword, padding with the other of 0 and 1 the end of the shortest encoded codeword from the encoded codewords obtained by the variable length encoding to obtain a prefix, and combining the prefix with the obtained respective original encoded codewords of the first set of values to obtain respective combined codewords of the first set of values.

6. The data compression device according to claim 5, wherein:
    the encoding unit is further configured to form a code table, the code table at least comprising: each value in the first set of values and their respective combined codewords; and each value in the second set of values and their respective encoded codewords or padded codewords.

7. The data compression device according to claim 5, wherein the variable length encoding is Shannon encoding, Feno encoding or Huffman encoding.

8. A non-transitory computer-readable storage medium, having a computer instruction stored therein, wherein, when executed by a processor, the computer instruction implements the data compression method according to claim 1.

* * * * *